(12) United States Patent
Chien

(10) Patent No.: US 12,557,236 B2
(45) Date of Patent: Feb. 17, 2026

(54) LEVEL HOLDING COMPONENTS ON A HANDLE OF A STORAGE TRAY

(71) Applicant: DELL PRODUCTS L.P., Round Rock, TX (US)

(72) Inventor: Tung-Yu Chien, New Taipei (TW)

(73) Assignee: Dell Products L.P., Round Rock, TX (US)

( * ) Notice: Subject to any disclaimer, the term of this patent is extended or adjusted under 35 U.S.C. 154(b) by 117 days.

(21) Appl. No.: 18/647,892

(22) Filed: Apr. 26, 2024

(65) Prior Publication Data
US 2025/0338424 A1 Oct. 30, 2025

(51) Int. Cl.
*H05K 7/14* (2006.01)

(52) U.S. Cl.
CPC .................. *H05K 7/1489* (2013.01)

(58) Field of Classification Search
None
See application file for complete search history.

(56) References Cited

U.S. PATENT DOCUMENTS

| | | | | |
|---|---|---|---|---|
| 10,251,300 B1* | 4/2019 | Mao | ...................... | H05K 7/1487 |
| 10,470,334 B1* | 11/2019 | Mao | ...................... | H05K 7/1489 |
| 10,863,644 B1* | 12/2020 | Tseng | ................... | H05K 7/1487 |
| 11,683,904 B2* | 6/2023 | Chang | ................... | H05K 7/1489 |
| | | | | 361/679.02 |
| 12,366,902 B2* | 7/2025 | Mao | ...................... | H05K 7/1487 |
| 2009/0273901 A1* | 11/2009 | Jaramillo | ............. | H05K 7/1492 |
| | | | | 361/679.58 |
| 2015/0103492 A1* | 4/2015 | Wu | ...................... | H05K 7/1431 |
| | | | | 361/726 |
| 2018/0160563 A1 | 6/2018 | Hung et al. | | |
| 2018/0329463 A1* | 11/2018 | Liu | ......................... | G06F 1/182 |
| 2019/0107869 A1 | 4/2019 | Hung et al. | | |
| 2020/0146185 A1* | 5/2020 | Wu | ...................... | H05K 7/20172 |
| 2021/0385962 A1* | 12/2021 | Chang | ................... | H05K 7/1409 |
| 2022/0377926 A1* | 11/2022 | Wang | ...................... | G06F 1/183 |

* cited by examiner

*Primary Examiner* — Allen L Parker
*Assistant Examiner* — Christopher L Augustin
(74) *Attorney, Agent, or Firm* — Larson Newman, LLP

(57) ABSTRACT

A storage tray for an information handling system includes a frame and a handle. The frame includes a camming slot, which in turn includes a stop point, a drop point, and a rotate point. The handle in physical communication with the frame and includes a camming post located within the camming slot. The camming post is located at the stop point when the handle is in a default position. The camming post prevents rotation of the handle when the camming post is at the stop point. The camming post is located at the drop point when the handle is pushed downward. The camming post is located at the rotate point when the handle is in a closed position.

20 Claims, 6 Drawing Sheets

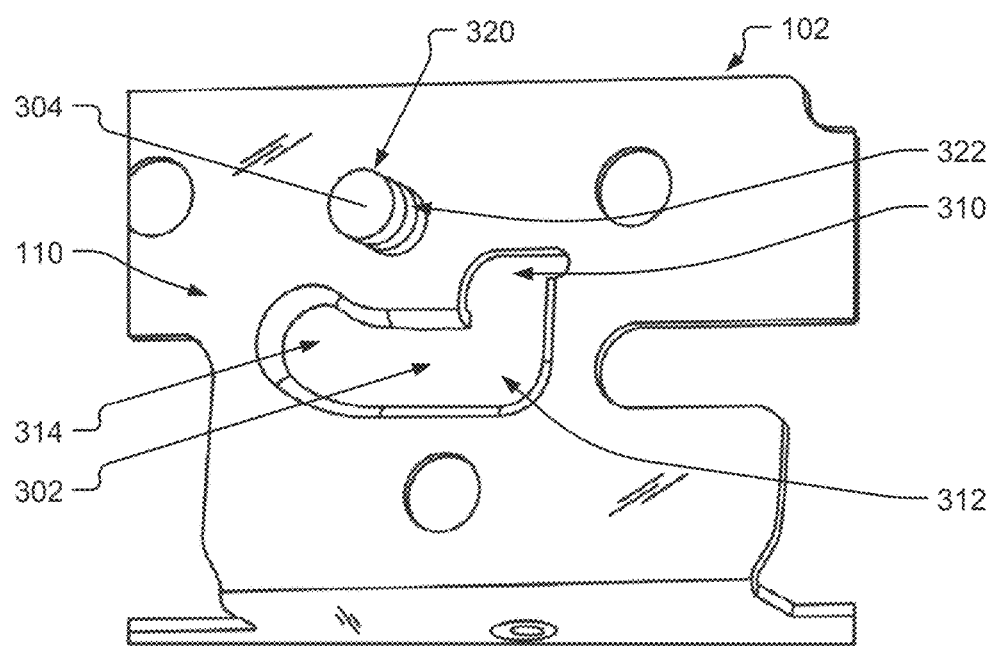
FIG. 3
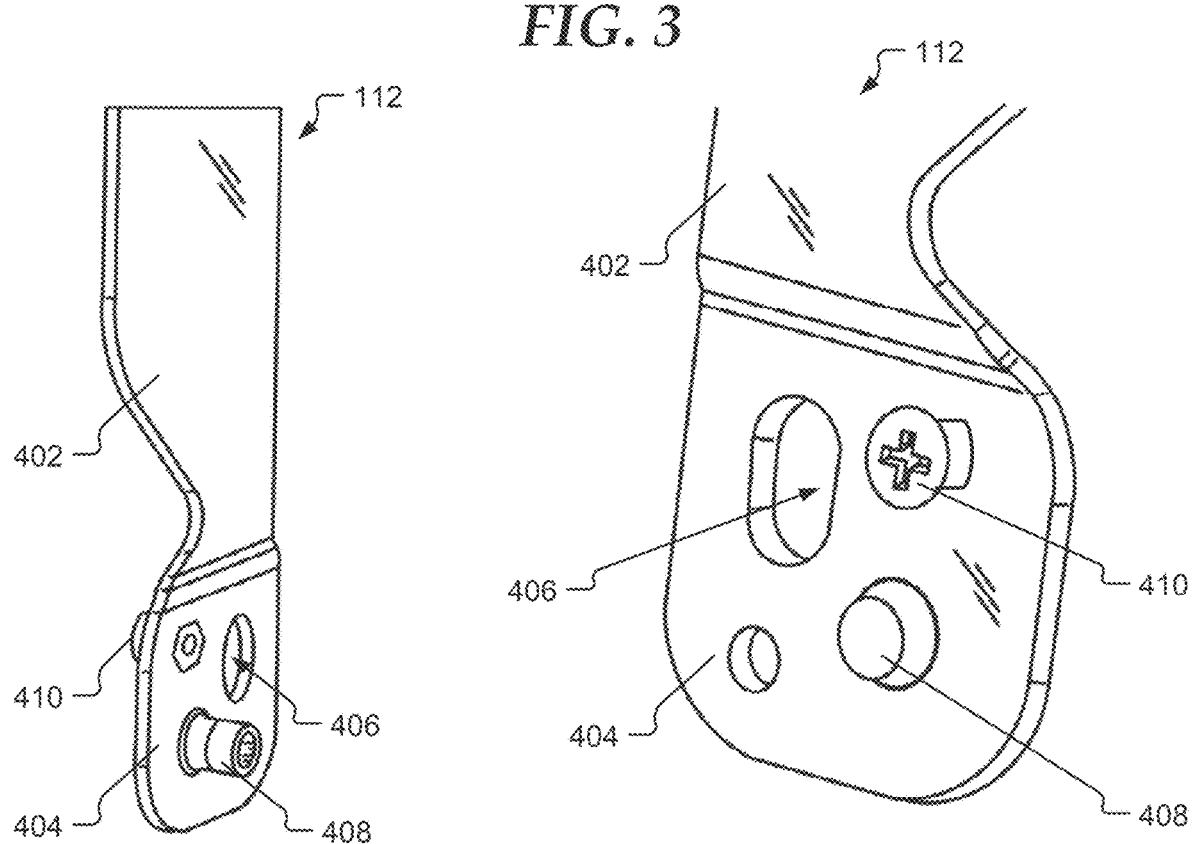
FIG. 4
FIG. 5

LEVEL HOLDING COMPONENTS ON A HANDLE OF A STORAGE TRAY

FIELD OF THE DISCLOSURE

The present disclosure generally relates to information handling systems, and more particularly relates to level holding components on a handle of a storage tray.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A storage tray for an information handling system includes a frame and a handle. The frame includes a camming slot, which in turn includes a stop point, a drop point, and a rotate point. The handle in physical communication with the frame and includes a camming post located within the camming slot. The camming post may be located at the stop point when the handle is in a default position. The camming post may prevent rotation of the handle when the camming post is at the stop point. The camming post may be located at the drop point when the handle is pushed downward. The camming post may be located at the rotate point when the handle is in a closed position.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which:

FIG. 3 is a diagram of a portion of a storage tray according to at least one embodiment of the present disclosure;

FIGS. 4 and 5 are diagrams of a portion of handle for a storage tray according to at least one embodiment of the present disclosure;

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
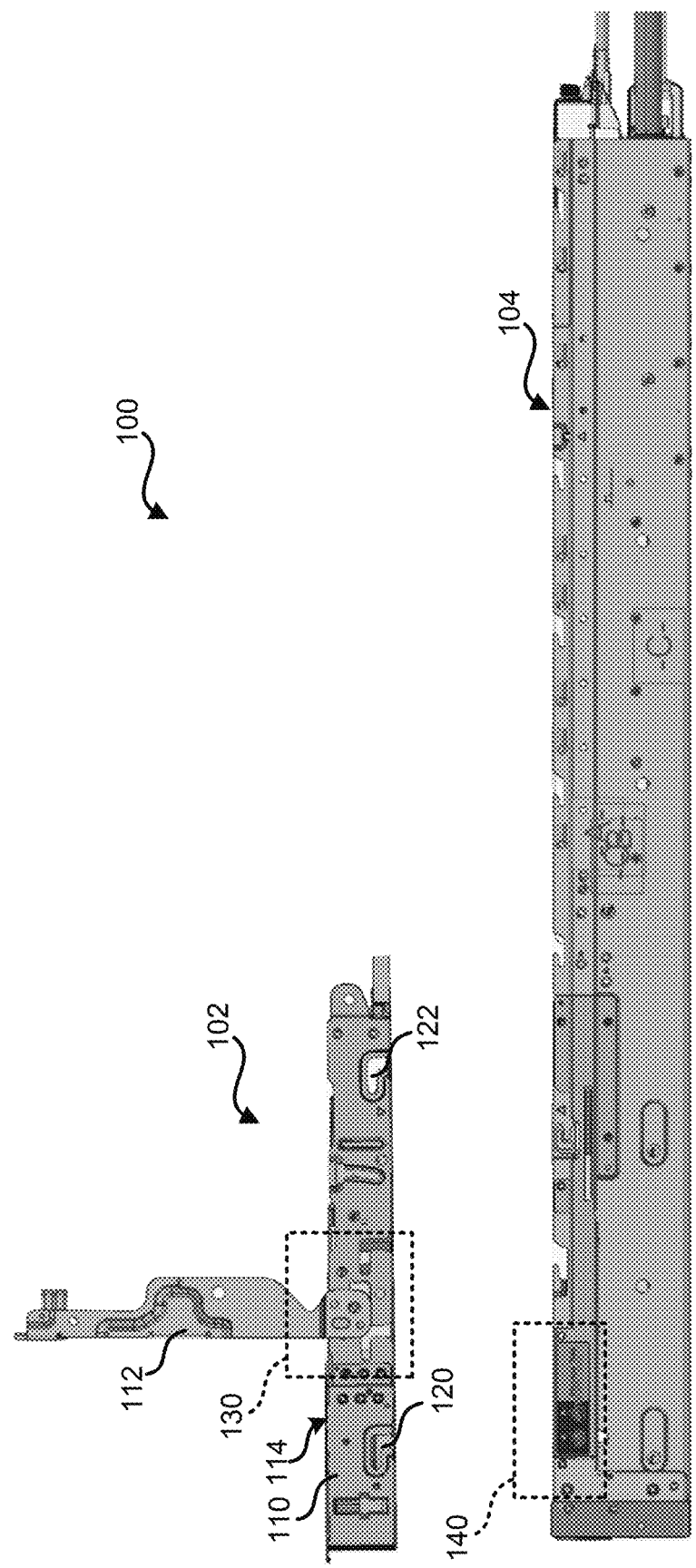
FIG. 1 is a side view of an information handling system including a server chassis and a storage tray according to at least one embodiment of the present disclosure.

FIG. 1 illustrates an information handling system 100 according to at least one embodiment of the present disclosure. For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (such as a desktop or laptop), tablet computer, mobile device (such as a personal digital assistant (PDA) or smart phone), server (such as a blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Information handling system 100 includes a storage tray 102 and a server chassis 104. In an example, server chassis 104 may include any suitable components, such as those described with respect to FIG. 10 below. Storage tray 102 includes a frame 110, a handle 112, and a cover 114. Frame 110 includes locking slots 120 and 122. Both storage tray 102 and server chassis 104 may include additional components without varying from the scope of this disclosure.

In an example, storage tray 102 may hold multiple components for information handling system 100. For example, the components within storage tray 102 may include, but are not limited to, hard disk drives (HDDs), cooling fans, fan boards, cables, and printed circuit boards (PCBs). However, the weight distribution of the components may not be balanced from one end of storage tray 102 to the other. In this situation, handle 112 may include multiple level holding components, such as level holding components illustrated in FIG. 3-9, to ensure that storage tray 102 is always horizontal while the storage tray is being inserted into or removed from server chassis 104. A portion of storage tray 130 is illustrated in and described with respect to FIGS. 6-9 below.

Figure 2:
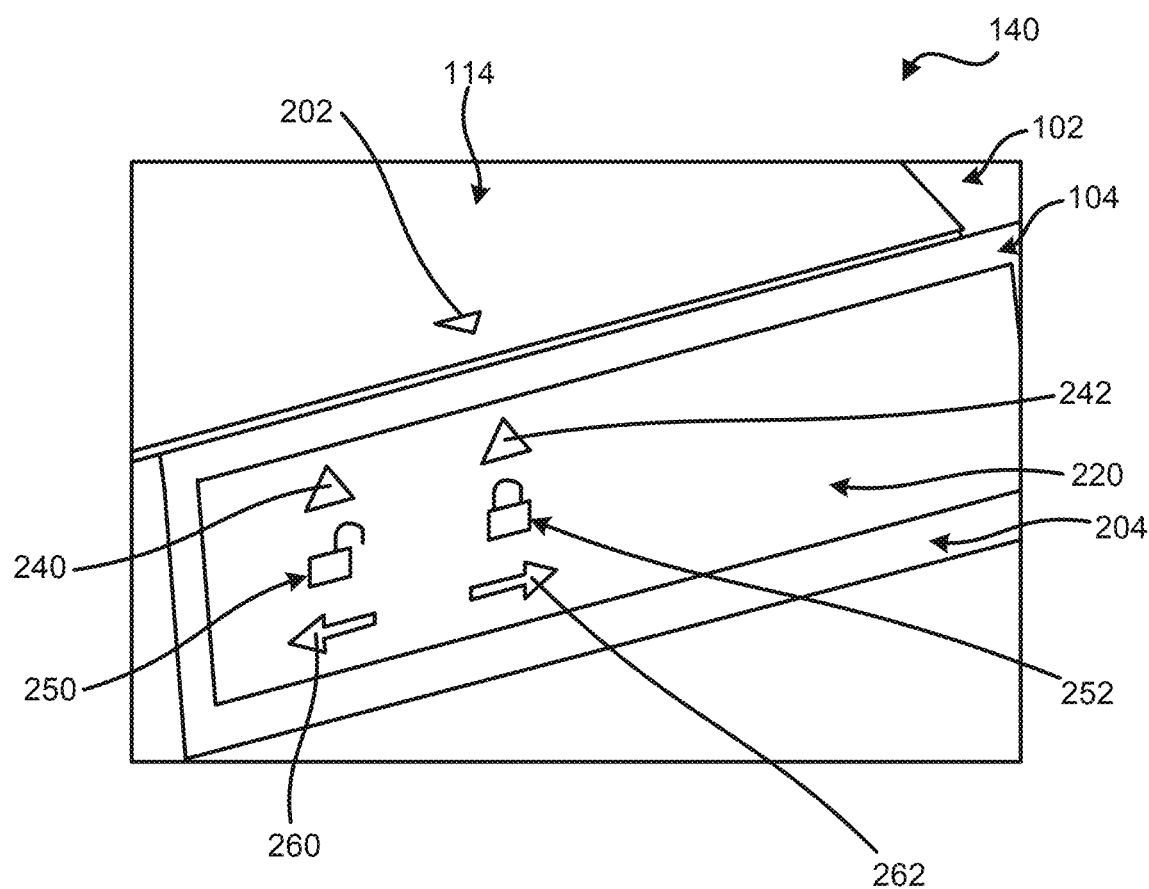
FIG. 2 is a diagram of a portion of a storage tray within a server chassis according to at least one embodiment of the present disclosure.

When storage tray 102 is inserted within server chassis 104 the opening in each respective one of locking slots 120 and 122 may receive a different post located within the server chassis. After the storage tray 102 is fully inserted within server chassis 104, the posts of server chassis 104 may slide within the respective locking slots 120 and 122 to enable the storage tray to slide to a locked position as illustrated in FIG. 2. In an example, storage tray 102 also may slide in the opposite direction and be placed in an unlocked position, such that an individual may utilize handle 112 to remove the storage tray 102 from server chassis 104. A portion 140 of server chassis 104 is illustrated in FIG. 2.

FIG. 2 illustrates portion 140 of storage tray 102 within server chassis 140 according to at least one embodiment of the present disclosure. Cover 114 of storage tray 102 includes a position indication triangle 210. Server chassis 140 includes a frame 204, which in turn includes an alignment features panel 220. Alignment features panel 220 includes position alignment triangles 240 and 242, unlocked position indicator 250, locked position indicator 252, and direction arrows 260 and 262. In certain examples, direction arrows 260 and 262 may indicate to an individual the directions that storage tray 102 may slide to place the storage tray in either the unlocked or locked positions.

In an example, when storage tray 102 is first inserted within server chassis 104, position indication triangle 210 may align with position alignment triangle 240. In this example, when position indication triangle 210 aligns with position alignment triangle 240, unlocked position indicator 250 below position alignment triangle 240 may indicate to an individual that storage tray 102 is in the unlocked position. Additionally, if storage tray 114 is moved in the direction of arrow 262, position indication triangle 210 may align with position alignment triangle 242. In this situation, when position indication triangle 210 aligns with position alignment triangle 242, locked position indicator 252 below position alignment triangle 242 may indicate to an individual that storage tray 102 is in the unlocked position.

FIG. 3 illustrates a portion of storage tray 102 including multiple level holding components according to at least one embodiment of the present disclosure. Storage tray 102 includes a camming slot 302 and a hinge point post 304. Camming slot 302 includes a stop point 310, a drop point 312, and a rotate point 314. Hinge point post 304 includes notches 320 and 322. In an example, the multiple level holding components include, but are not limited to, camming slot 302 and hinge point post 304. Storage tray 102 may include additional components without varying from the scope of this disclosure. As will be described below with respect to FIGS. 6-9, camming slot 302 and hinge point post 304 may interact with components of handle 112 of FIGS. 4 and 5 to keep storage tray 102 level during insertion into or removal from a server chassis, such as server chassis 104 of FIG. 1.

FIGS. 4 and 5 illustrate a portion of handle 112 according to at least one embodiment of the present disclosure. Handle 112 includes a top portion 402 and a bottom portion 404, a hinge sliding slot 406, a camming post 408, and a screw 410. In an example, top portion 402 may extend upward from bottom portion 404 and connect to a top portion of another handle of server tray 102 of FIG. 1. In certain examples, sliding slot 406 may enable handle 112 to slide and rotate with respect to frame 110 in FIG. 3. In an example, camming post 408 may control whether handle 112 is in a locked position or in an unlocked/rotational position and screw 410 may be utilized to bias the handle toward the locked position as will be described with respect to FIGS. 6-9 below.

FIGS. 6-9 illustrate portion 130 of storage tray 102 according to at least one embodiment of the present disclosure. As illustrated in FIGS. 6-9, handle 112 is in physical communication with frame 110 of storage tray 102. Storage tray 102 includes a lock washer 602 in physical communication with notch 322 of hinge point post 304. Storage tray 102 may include a handle on opposite sides of frame 110 and the handles may be substantially similar with a connection portion extending between the handles. For clarity and brevity, the description of level holding components will be described only with respect to handle 112 and the side of frame 110 illustrated in FIGS. 6-9. One of ordinary skill would recognize that the level holding components for another handle on the opposite side of frame 110 would be substantially similar. Storage tray 102 may include additional components without varying from the scope of this disclosure.

In certain examples, hinge point post 304 may extend through hinge sliding slot 406 and locking washer 602 may securely hold handle 112 in physical communication with frame 110. In an example, camming post 408 extends through camming slot 302 and may be located at different positions of the camming slot, such as stop point 310, drop point 312, and rotate point 314, based on different forces being exerted on handle 112. In certain examples, level holding components may be positioned at different locations with respect to one another based on the different forces being exerted on handle 112.

Figure 6:
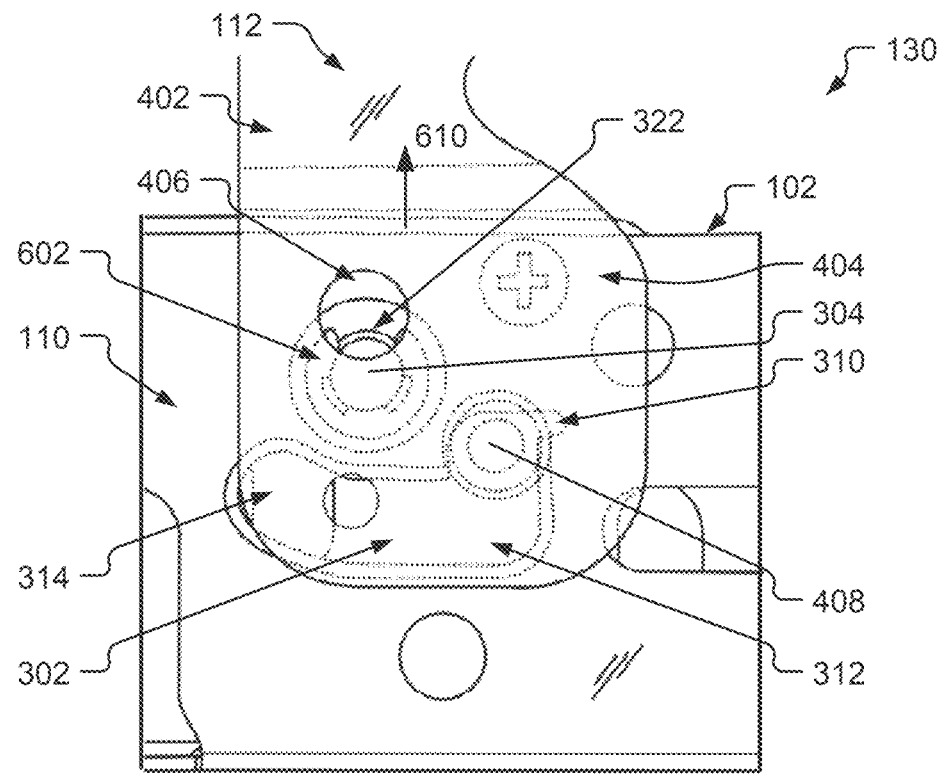
FIGS. 6-9 are diagrams of a portion of a storage tray within a server chassis according to at least one embodiment of the present disclosure.

Referring to FIG. 6, when handle 112 is in a default position and/or a force is pulling the handle in the direction of arrow 610, hinge point post 304 may be located at the bottom of hinge sliding slot 406. Additionally, when handle 112 is in the default position and/or a force is pulling the handle in the direction of arrow 610, camming post 408 may be located at stop point 310 of camming slot 302. When camming post 408 is located at stop point 310, the camming post may be in physical communication with the edges of the stop point. This position of camming post 408 may enable the camming post to prevent storage tray 102 from titling based on the weights of the components in the storage tray not being balanced within the tray. For example, the physical communication between camming post 408 and the edges of stop point 310 may prevent handle 112 from rotating with respect to frame 110 of storage tray 102. Thus, storage tray 102 may remain horizontal while the storage tray is being inserted within or being removed from server chassis 104 of FIG. 1.

Figure 7:
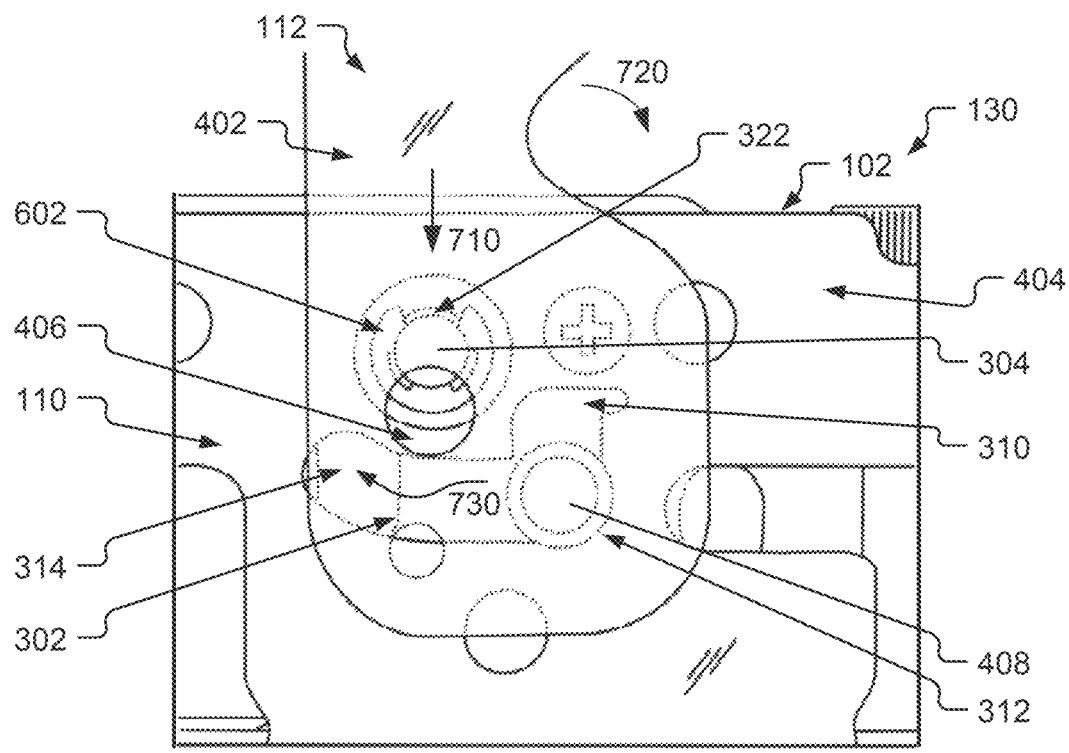

Referring to FIG. 7, when a force is exerted on handle 112 in the direction of arrow 710, hinge point post 304 may be located at the top of hinge sliding slot 406. Additionally, when the force is exerted on handle 112 in the direction of arrow 710, camming post 408 may be located at drop point 312 of camming slot 302. When camming post 408 is located at drop point 312, handle 112 may be able to rotate in the direction of arrow 720. In an example, handle 112 may rotate in the direction of arrow 720 around hinge point post 304. As handle 112 rotates in the direction of arrow 720, camming post 408 may transition or move from drop point 312 in the direction of arrow 730 until camming post 408 is located at rotate point 314. In an example, when camming post is located at rotate point 314, handle 112 may be in a closed position. In certain examples, when in the closed position, handle 112 may be substantially parallel with frame 110. In an example, different forces may be exerted in the opposite directions to move camming post back to stop point 310 and hinge point post 304 back to the top of hinge sliding slot 406.

Figure 8:
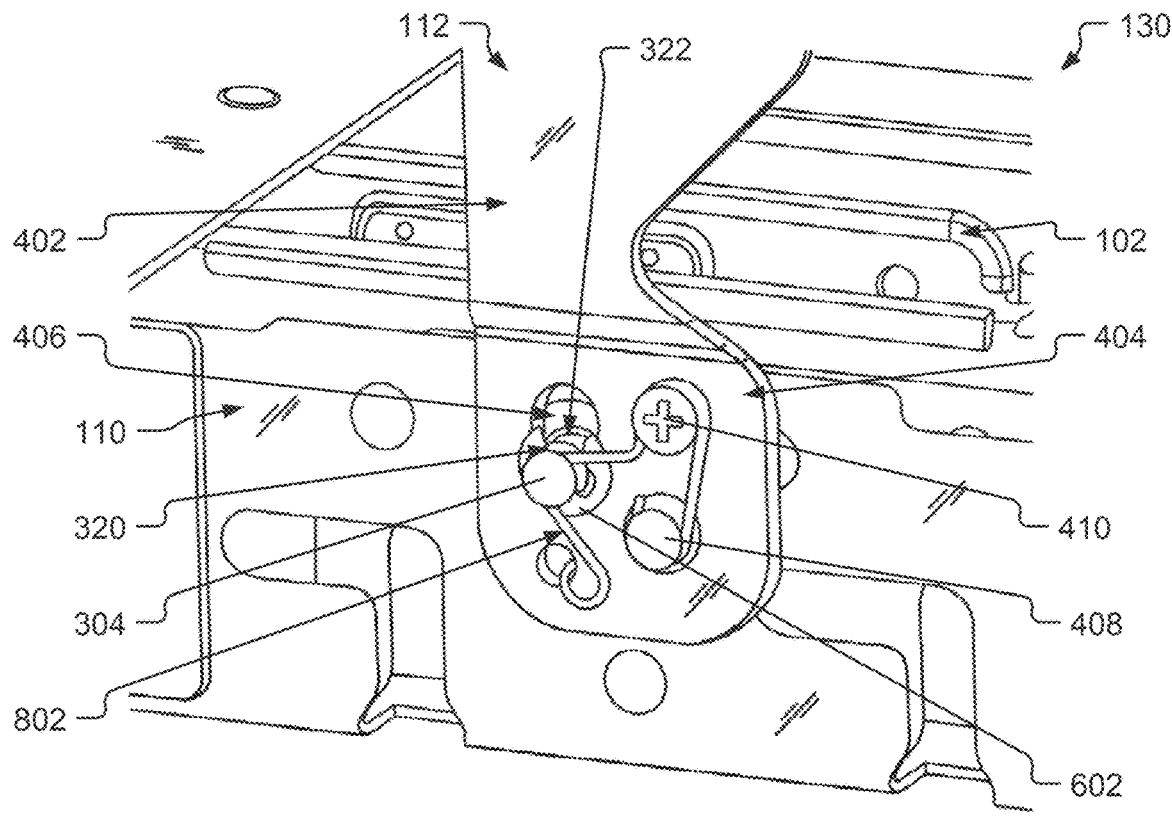
Figure 9:
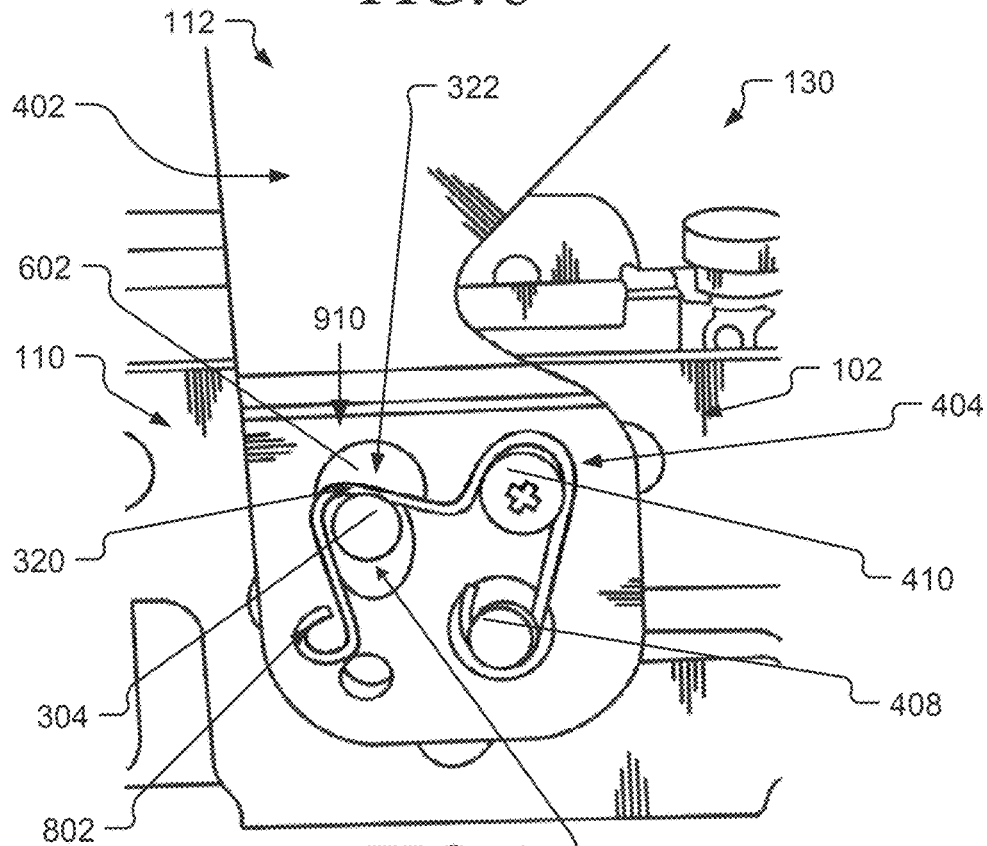

Referring to FIGS. 8 and 9, storage tray 102 further includes a wire spring 802. In an example, wire spring 802 may wrap around camming post 408, screw 410, and hinge point post 304. In certain examples, wire spring 802 may be located within notch 320 of hinge point post 304. Referring now to FIG. 8, in an example, wire spring 802 may exert particular forces on camming post 408, screw 410, and hinge point post 304 to bias handle 112 in the default position. In certain examples, camming post 408 and screw 410 may be permanently mounted in fixed positions with respect to each other. Based on the fixed positions of camming post 408 and screw 410, the shape of wire spring 802 may pull or force hinge point post 304 toward the bottom of hinge sliding slot 406. Thus, wire spring 802 creates the default position of handle 112 with hinge point post 304 at the bottom of hinge sliding slot 406 and camming post 408 at stop point 310 of camming slot 302 as illustrated in FIG. 6.

Referring to FIG. 9, when a force is exerted on handle 112 in the direction of arrow 910, hinge point post 304 may transition from the bottom of hinge sliding slot 406 to the top of the hinge sliding slot. Additionally, the force exerted on handle 112 in the direction of arrow 910 has to be greater than the force of wire spring 802 biasing hinge point post 304 at the bottom of hinge sliding slot 406. When this force exerted on handle 112 is greater than the force of wire spring 802, handle 112 may rotate to the closed position as described above with respect to FIG. 7. In an example, when the force on handle 112 is removed, wire spring 802 may automatically cause the handle to transition back towards the default position. For example, wire spring 802 may exert a force on hinge point post 304 to bias the hinge point post toward the bottom on hinge sliding slot 406 and place handle 112 in the default position.

Figure 10:
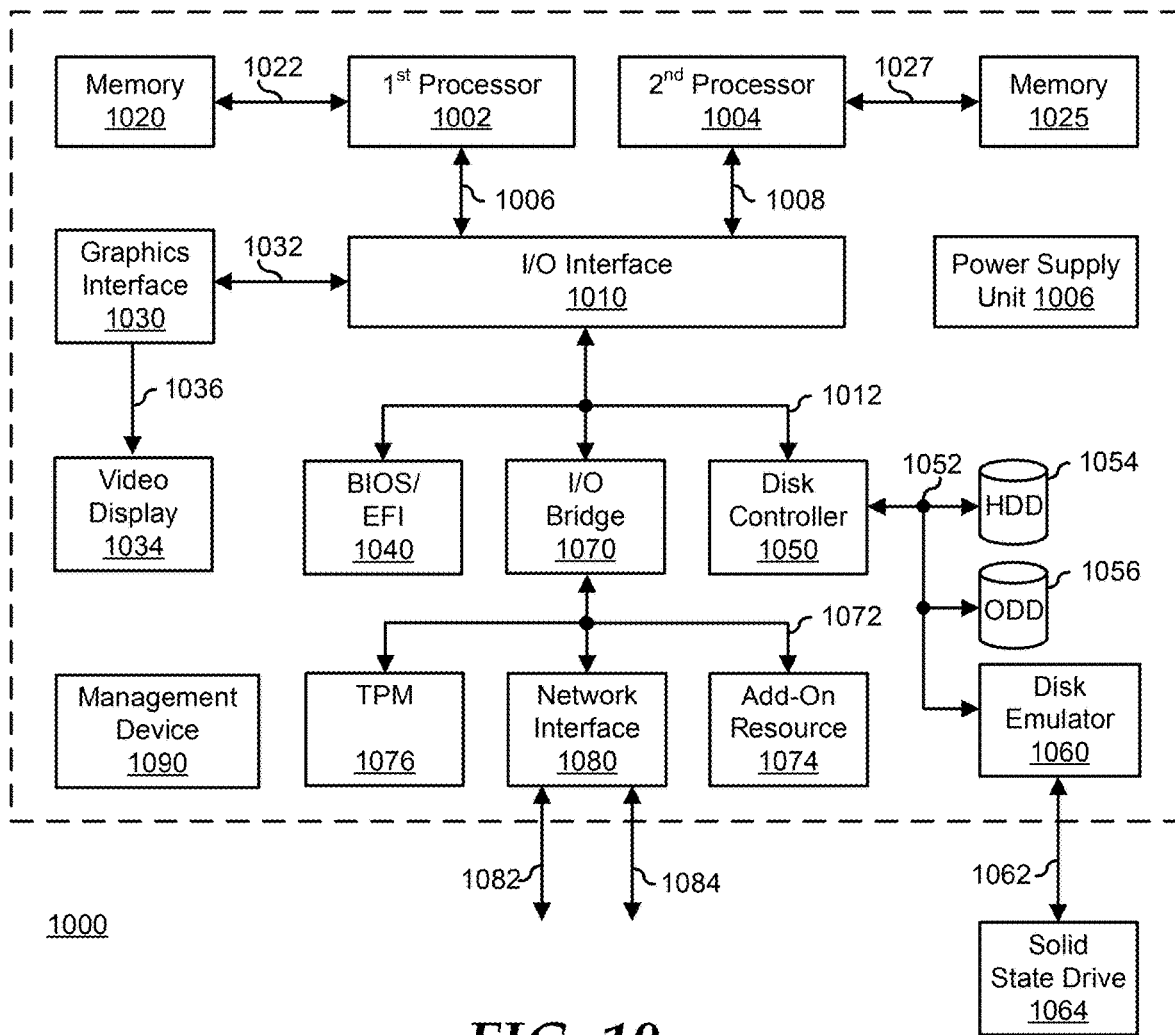
FIG. 10 is a block diagram of a general information handling system according to an embodiment of the present disclosure.

FIG. 10 shows a generalized embodiment of an information handling system 1000 according to an embodiment of the present disclosure. In an example, the components of information handling system 1000 may be substantially similar to components within server chassis 102 of FIG. 1. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 1000 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 1000 can include processing resources for executing machine-executable code, such as a central processing unit (CPU), a programmable logic array (PLA), an embedded device such as a System-on-a-Chip (SoC), or other control logic hardware. Information handling system 1000 can also include one or more computer-readable medium for storing machine-executable code, such as software or data. Additional components of information handling system 1000 can include one or more storage devices that can store machine-executable code, one or more communications ports for communicating with external devices, and various input and output (I/O) devices, such as a keyboard, a mouse, and a video display. Information handling system 1000 can also include one or more buses operable to transmit information between the various hardware components.

Information handling system 1000 can include devices or modules that embody one or more of the devices or modules described below and operates to perform one or more of the methods described below. Information handling system 1000 includes a processors 1002 and 1004, an input/output (I/O) interface 1010, memories 1020 and 1025, a graphics interface 1030, a basic input and output system/universal extensible firmware interface (BIOS/UEFI) module 1040, a disk controller 1050, a hard disk drive (HDD) 1054, an optical disk drive (ODD) 1056, a disk emulator 1060 connected to an external solid state drive (SSD) 1064, an I/O bridge 1070, one or more add-on resources 1074, a trusted platform module (TPM) 1076, a network interface 1080, a management device 1090, and a power supply 1095. Processors 1002 and 1004, I/O interface 1010, memory 1020, graphics interface 1030, BIOS/UEFI module 1040, disk controller 1050, HDD 1054, ODD 1056, disk emulator 1060, SSD 1064, I/O bridge 1070, add-on resources 1074, TPM 1076, and network interface 1080 operate together to provide a host environment of information handling system 1000 that operates to provide the data processing functionality of the information handling system. The host environment operates to execute machine-executable code, including platform BIOS/UEFI code, device firmware, operating system code, applications, programs, and the like, to perform the data processing tasks associated with information handling system 1000.

In the host environment, processor 1002 is connected to I/O interface 1010 via processor interface 1006, and processor 1004 is connected to the I/O interface via processor interface 1008. Memory 1020 is connected to processor 1002 via a memory interface 1022. Memory 1025 is connected to processor 1004 via a memory interface 1027. Graphics interface 1030 is connected to I/O interface 1010 via a graphics interface 1032 and provides a video display output 1036 to a video display 1034. In a particular embodiment, information handling system 1000 includes separate memories that are dedicated to each of processors 1002 and 1004 via separate memory interfaces. An example of memories 1020 and 1030 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 1040, disk controller 1050, and I/O bridge 1070 are connected to I/O interface 1010 via an I/O channel 1012. An example of I/O channel 1012 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 1010 can also include one or more other I/O interfaces, including an Industry Standard Architecture (ISA) interface, a Small Computer Serial Interface (SCSI) interface, an Inter-Integrated Circuit (I$^2$C) interface, a System Packet Interface (SPI), a Universal Serial Bus (USB), another interface, or a combination thereof. BIOS/UEFI module 1040 includes BIOS/UEFI code operable to detect resources within information handling system 1000, to provide drivers for the resources, initialize the resources, and access the resources. BIOS/UEFI module 1040 includes code that operates to detect resources within information handling system 1000, to provide drivers for the resources, to initialize the resources, and to access the resources.

Disk controller 1050 includes a disk interface 1052 that connects the disk controller to HDD 1054, to ODD 1056, and to disk emulator 1060. An example of disk interface 1052 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 1060 permits SSD 1064 to be connected to information handling system 1000 via an external interface 1062. An example of external interface 1062 includes a USB interface, an IEEE 4394 (Firewire) interface, a proprietary interface, or a combination thereof. Alternatively, solid-state drive 1064 can be disposed within information handling system 1000.

I/O bridge 1070 includes a peripheral interface 1072 that connects the I/O bridge to add-on resource 1074, to TPM 1076, and to network interface 1080. Peripheral interface 1072 can be the same type of interface as I/O channel 1012 or can be a different type of interface. As such, I/O bridge 1070 extends the capacity of I/O channel 1012 when peripheral interface 1072 and the I/O channel are of the same type, and the I/O bridge translates information from a format suitable to the I/O channel to a format suitable to the peripheral channel 1072 when they are of a different type. Add-on resource 1074 can include a data storage system, an additional graphics interface, a network interface card (NIC), a sound/video processing card, another add-on resource, or a combination thereof. Add-on resource 1074 can be on a main circuit board, on separate circuit board or add-in card disposed within information handling system 1000, a device that is external to the information handling system, or a combination thereof.

Network interface 1080 represents a NIC disposed within information handling system 1000, on a main circuit board of the information handling system, integrated onto another component such as I/O interface 1010, in another suitable location, or a combination thereof. Network interface device 1080 includes network channels 1082 and 1084 that provide interfaces to devices that are external to information handling system 1000. In a particular embodiment, network channels 1082 and 1084 are of a different type than peripheral channel 1072 and network interface 1080 translates information from a format suitable to the peripheral channel to a format suitable to external devices. An example of network channels 1082 and 1084 includes InfiniBand channels, Fibre Channel channels, Gigabit Ethernet channels, proprietary channel architectures, or a combination thereof. Network channels 1082 and 1084 can be connected to external network resources (not illustrated). The network resource can include another information handling system, a data storage system, another network, a grid management system, another suitable resource, or a combination thereof.

Management device 1090 represents one or more processing devices, such as a dedicated baseboard management controller (BMC) System-on-a-Chip (SoC) device, one or more associated memory devices, one or more network interface devices, a complex programmable logic device (CPLD), and the like, which operate together to provide the management environment for information handling system 1000. In particular, management device 1090 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 1000, such as system cooling fans and power supplies. Management device 1090 can include a network connection to an external management system, and the management device can communicate with the management system to report status information for information handling system 1000, to receive BIOS/UEFI or system firmware updates, or to perform other task for managing and controlling the operation of information handling system 1000.

Management device 1090 can operate off of a separate power plane from the components of the host environment so that the management device receives power to manage information handling system 1000 when the information handling system is otherwise shut down. An example of management device 1090 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 1090 may further include associated memory devices, logic devices, security devices, or the like, as needed, or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A storage tray for an information handling system, the storage tray comprising:
    a frame including a camming slot, wherein the camming slot includes a stop point, a drop point, and a rotate point; and
    a handle in physical communication with the frame, the handle including a camming post located within the camming slot, the camming post located at the stop point when the handle is in a default position, wherein the camming post prevents rotation of the handle when the camming post is at the stop point, the camming post located at the drop point when a downward force is exerted on the handle, and the camming post located at the rotate point when the handle is in a closed position.

2. The storage tray of claim 1, wherein the handle further includes a hinge sliding slot, and the frame further includes a hinge point post, wherein the hinge point post is located at a bottom of the hinge sliding slot when the handle is in the default position.

3. The storage tray of claim 2, wherein the hinge point post is located at a top of the hinge sliding slot when the handle is in the closed position.

4. The storage tray of claim 2, further comprising a wire spring in physical communication with the hinge point post and with the camming post, the wire spring to bias the handle toward the default position.

5. The storage tray of claim 4, wherein the camming post is configured to transition from the stop point to the drop point when the downward force is greater than a force exerted by the wire spring.

6. The storage tray of claim 2, wherein the handle rotates from the default position to the closed position around the hinge point post.

7. The storage tray of claim 2, further comprising a lock washer located within a notch of the hinge point post, wherein the lock washer secures the handle in physical communication with the frame.

8. The storage tray of claim 1, further comprising a plurality of components, wherein a weight of the components within the storage tray is unbalanced, wherein the camming post holds the storage tray horizontally when the camming post is at the stop point.

9. An information handling system comprising:
a server chassis; and
a storage tray to be placed in physical communication with the server chassis, the storage tray including:
a frame having a camming slot, wherein the camming slot includes a stop point, a drop point, and a rotate point; and
a handle in physical communication with the frame, the handle including a camming post located within the camming slot, wherein the camming post is located at the stop point when the handle is in a default position, wherein the camming post prevents rotation of the handle when the camming post is at the stop point, the camming post is located at the drop point when a downward force is exerted on the handle, and the camming post is located at the rotate point when the handle is in a closed position.

10. The information handling system of claim 9, wherein the handle further includes a hinge sliding slot, and the frame further includes a hinge point post, wherein the hinge point post is located at a bottom of the hinge sliding slot when the handle is in the default position.

11. The information handling system of claim 10, wherein the hinge point post is located at a top of the hinge sliding slot when the handle is in the closed position.

12. The information handling system of claim 10, further comprising a wire spring in physical communication with the hinge point post and with the camming post, the wire spring to bias the handle toward the default position.

13. The information handling system of claim 12, wherein the camming post is configured to transition from the stop point to the drop point when the downward force is greater than a force exerted by the wire spring.

14. The information handling system of claim 10, wherein the handle rotates from the default position to the closed position around the hinge point post.

15. The information handling system of claim 10, further comprising a lock washer located within a notch of the hinge point post, wherein the lock washer secures the handle in physical communication with the frame.

16. The information handling system of claim 9, wherein the storage tray further includes a plurality of components, wherein a weight of the components within the storage tray is unbalanced, wherein the camming post holds the storage tray horizontally when the camming post is at the stop point.

17. A storage tray for an information handling system, the storage tray comprising:
a frame including:
a hinge point post; and
a camming slot having a stop point, a drop point, and a rotate point;
a handle in physical communication with the frame, the handle including:
a hinge sliding slot, wherein the hinge point post is located at a bottom of the hinge sliding slot when the handle is in a default position, wherein the handle rotates from the default position to a closed position around the hinge point post; and
a camming post located within the camming slot, the camming post located at the stop point when the handle is in the default position, wherein the camming post prevents rotation of the handle when the camming post is at the stop point, the camming post is located at the drop point when a downward force is exerted on the handle, and the camming post is located at the rotate point when the handle is in the closed position; and
a wire spring in physical communication with the hinge point post and with the camming post, the wire spring to bias the handle toward the default position.

18. The storage tray of claim 17, wherein the camming post is configured to transition from the stop point to the drop point when the downward force is greater than a force exerted by the wire spring.

19. The storage tray of claim 17, further comprising a plurality of components, wherein a weight of the components within the storage tray is unbalanced, wherein the camming post holds the storage tray horizontally when the camming post is at the stop point.

20. The storage tray of claim 17, further comprising a lock washer located within a notch of the hinge point post, wherein the lock washer secures the handle in physical communication with the frame.

* * * * *